(12) United States Patent
MacGarry et al.

(10) Patent No.: US 10,540,248 B2
(45) Date of Patent: Jan. 21, 2020

(54) APPARATUS FOR CONTROLLING ACCESS TO A MEMORY DEVICE, AND A METHOD OF PERFORMING A MAINTENANCE OPERATION WITHIN SUCH AN APPARATUS

(71) Applicant: ARM Limited, Cambridge (GB)

(72) Inventors: Fergus Wilson MacGarry, Cambridge (GB); Michael Andrew Campbell, Waterbeach (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/593,560

(22) Filed: May 12, 2017

(65) Prior Publication Data
US 2017/0371560 A1    Dec. 28, 2017

(30) Foreign Application Priority Data
Jun. 28, 2016    (EP) .................................... 16176680

(51) Int. Cl.
*G06F 3/06*    (2006.01)
*G06F 13/16*    (2006.01)
(Continued)

(52) U.S. Cl.
CPC .......... *G06F 11/22* (2013.01); *G06F 11/1064* (2013.01); *G06F 11/3037* (2013.01);
(Continued)

(58) Field of Classification Search
CPC ............... G06F 13/1689; G06F 3/0619; G06F 13/1673; G06F 13/1626; G06F 13/161;
(Continued)

(56) References Cited

U.S. PATENT DOCUMENTS 6,310,814 B1 *  10/2001  Hampel ................ G11C 11/406
                                                365/203
9,432,298 B1 *   8/2016  Smith ................. H04L 49/9057
(Continued)

OTHER PUBLICATIONS

Sanjay K. Bose, Hardware and Software of Personal Computers, 1996, New Age International, p. 16, ISBN: 9788122403039.*
(Continued)

*Primary Examiner* — Reginald G Bragdon
*Assistant Examiner* — Curtis James Kortman
(74) *Attorney, Agent, or Firm* — Nixon & Vanderhye P.C.

(57) ABSTRACT

A technique is described for performing a maintenance operation within an apparatus that is used to control access to a memory device. The apparatus has a storage device for storing access requests to be issued to the memory device, and maintenance circuitry for performing a maintenance operation on storage elements provided within the storage device. Memory access execution circuitry is used to issue to a physical layer interface access requests selected from the storage device, for onward propagation from the physical layer interface to the memory device. Control circuitry is responsive to a training event to initiate a training operation of the physical layer interface. In addition, the control circuitry is further responsive to the training event to trigger performance of the maintenance operation by the maintenance circuitry whilst the training operation is being performed.

13 Claims, 5 Drawing Sheets

(51) Int. Cl.
*G06F 11/22* (2006.01)
*G06F 11/10* (2006.01)
*G11C 29/12* (2006.01)
*G06F 11/30* (2006.01)

(52) U.S. Cl.
CPC .......... *G06F 13/1673* (2013.01); *G11C 29/12* (2013.01); *G11C 2207/2254* (2013.01)

(58) Field of Classification Search
CPC .. G06F 3/0611; G06F 11/1064; G06F 11/141; G06F 12/126; G11C 29/022; G11C 29/028
See application file for complete search history.

(56) References Cited

U.S. PATENT DOCUMENTS

| | | | | |
|---|---|---|---|---|
| 2002/0065981 | A1* | 5/2002 | Jenne | G06F 13/161 711/105 |
| 2009/0044086 | A1* | 2/2009 | Craske | G06F 11/1064 714/799 |
| 2010/0174849 | A1* | 7/2010 | Walston | G06F 12/0246 711/103 |
| 2010/0205383 | A1* | 8/2010 | Blackmon | G06F 12/10 711/149 |
| 2011/0283060 | A1* | 11/2011 | Ware | G06F 13/1636 711/106 |
| 2011/0283142 | A1* | 11/2011 | Perronne | G06F 11/2284 714/35 |
| 2013/0117513 | A1* | 5/2013 | Brittain | G06F 13/16 711/152 |
| 2013/0227183 | A1 | 8/2013 | Shaeffer et al. | |
| 2014/0281161 | A1 | 9/2014 | Chen et al. | |
| 2016/0064066 | A1 | 3/2016 | Ware et al. | |
| 2016/0239442 | A1* | 8/2016 | Chun | G06F 13/18 |

OTHER PUBLICATIONS

Extended Search Report for EP16176680.3 dated Jan. 17, 2017, 7 pages.

* cited by examiner

“APPARATUS FOR CONTROLLING ACCESS TO A MEMORY DEVICE, AND A METHOD OF PERFORMING A MAINTENANCE OPERATION WITHIN SUCH AN APPARATUS

This application claims priority to EP Patent Application No. 16176680.3 filed Jun. 28, 2016, the entire contents of which are hereby incorporated by reference.

BACKGROUND

The present technique relates to an apparatus for controlling access to a memory device, and to a method of performing a maintenance operation within such an apparatus.

An apparatus used to control access to a memory device may receive access requests from a number of sources and may have access to a storage device in which the access requests to be issued to the memory device can be buffered. There are various types of maintenance operation that may be desirable to perform on at least some of the storage elements within such a storage device. For instance, certain maintenance operations may be performed to seek to improve the overall performance of the memory access operations, whilst other maintenance operations may be performed to seek to improve robustness, for example by seeking to detect occurrence of hard errors. However, the performance of such maintenance operations may impact on the overall performance of the apparatus.

Accordingly, it would be desirable to provide an improved technique for handling such maintenance operations.

SUMMARY

In a first example configuration there is provided an apparatus for controlling access to a memory device, comprising: a storage device to store access requests to be issued to the memory device; maintenance circuitry to perform a maintenance operation on storage elements provided within the storage device; memory access execution circuitry to issue to a physical layer interface access requests selected from the storage device, for onward propagation from the physical layer interface to the memory device; and control circuitry, responsive to a training event, to initiate a training operation of the physical layer interface; the control circuitry further being responsive to the training event to trigger performance of the maintenance operation by the maintenance circuitry whilst the training operation is being performed.

In another example configuration there is provided a method of performing a maintenance operation within an apparatus that controls access to a memory device, comprising: storing in a storage device access requests to be issued to the memory device; employing maintenance circuitry to perform the maintenance operation on storage elements provided within the storage device; issuing to a physical layer interface access requests selected from the storage device, for onward propagation from the physical layer interface to the memory device; responsive to a training event, employing control circuitry to initiate a training operation of the physical layer interface; and causing the control circuitry to trigger performance of the maintenance operation by the maintenance circuitry whilst the training operation is being performed.

In a yet further example configuration there is provided an apparatus for controlling access to a memory device, comprising: storage means for storing access requests to be issued to the memory device; maintenance means for performing a maintenance operation on storage elements provided within the storage means; memory access execution means for issuing to a physical layer interface access requests selected from the storage means, for onward propagation from the physical layer interface to the memory device; and control means for initiating, responsive to a training event, a training operation of the physical layer interface; the control means further for triggering, in response to the training event, performance of the maintenance operation by the maintenance means whilst the training operation is being performed.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
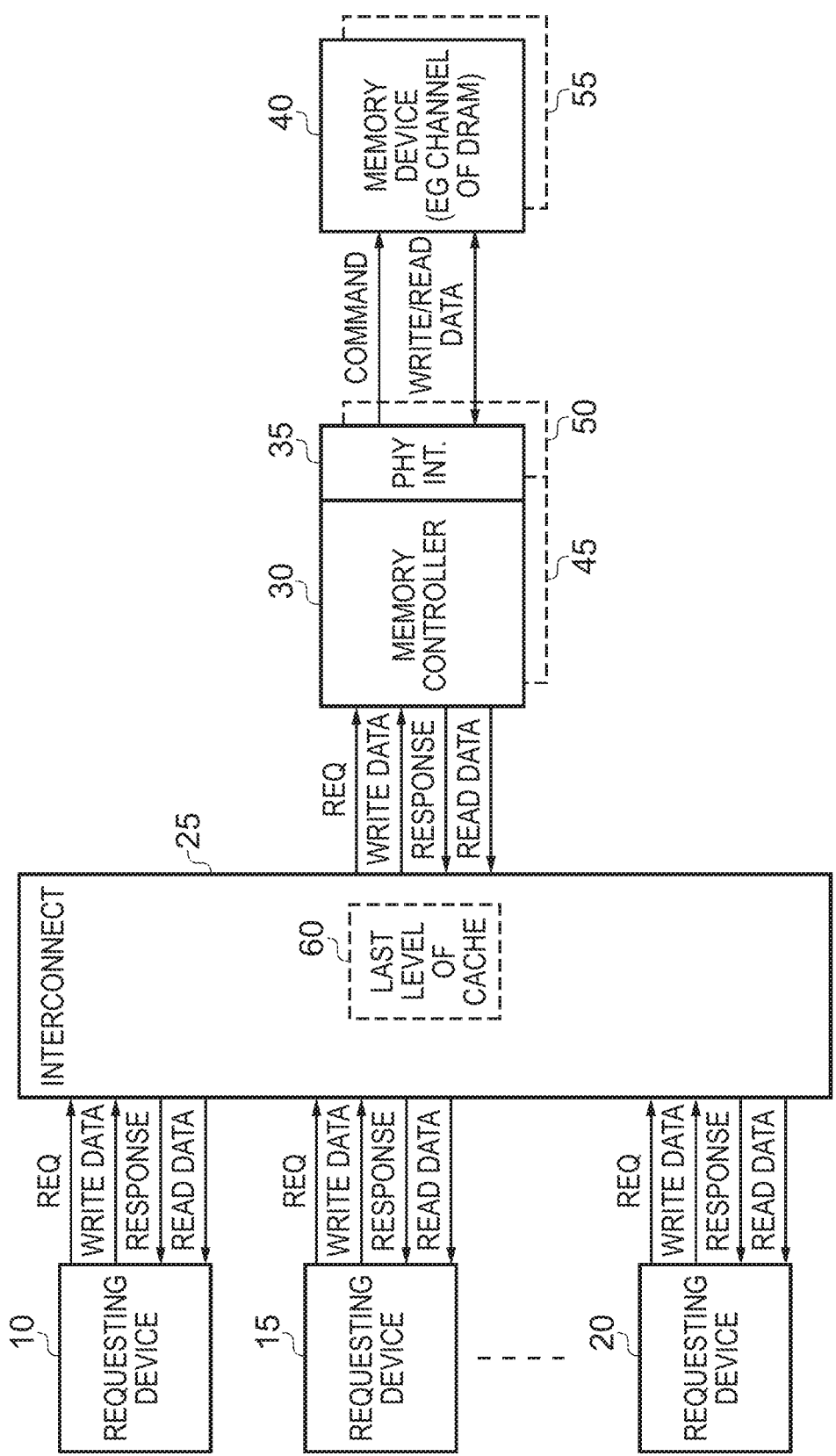
FIG. 1 is a block diagram of a system in accordance with one embodiment.

Before discussing the embodiments with reference to the accompanying figures, the following description of embodiments is provided.

In many modern systems, a number of components of the system may be integrated together on-chip and one or more of the components may need to communicate with a memory device. The memory device can take a variety of forms, one example being Dynamic Random Access Memory (DRAM), and in modern systems the storage capacity may be quite large. Often the memory device itself may be provided off-chip, with an on-chip memory controller being used to control access to that memory device.

The memory controller will typically have access to a storage device in which the access requests to be issued to the memory device can be buffered. There are various types of maintenance operation that may be desirable to perform on at least some of the storage elements within such a storage device. For instance, certain maintenance operations may be performed to seek to improve the overall performance of the memory access operations, for example by merging certain access requests, and/or by performing certain scheduling/ordering functions to order the memory requests within the storage device prior to them being issued to the memory device. Such tasks could be performed as a background operation, but there will be contention for the access bandwidth to the storage device between the normal read/write activity in the storage device required when processing the access requests in order to perform the accesses to the memory device, and the read/write activity in the storage device that is needed in order to perform the required maintenance tasks. Such background maintenance tasks hence have the potential to impact performance, particularly as the size of the storage device, and hence the number of storage elements to be subjected to maintenance, increases.

Further, other types of maintenance operation may also be desired to be performed. For example, built-in self-test (BIST) operations can be performed to check correct operation of the storage elements, and in particular detect when hard errors are present. Whilst traditionally such BIST tasks might only be performed as part of a manufacturing test, or at boot time, in certain applications, such as applications that are highly error intolerant, it may be desirable to also allow such BIST tests to be performed as maintenance operations during live use of the memory controller. However, the performance of such maintenance operations is then likely to impact on the overall performance of the apparatus.

Accordingly, the embodiments described herein seek to provide an improved technique for handling such maintenance operations.

In accordance with one embodiment, an apparatus is provided for controlling access to a memory device, the apparatus having a storage device to store access requests to be issued to the memory device, and maintenance circuitry to perform a maintenance operation on storage elements provided within the storage device. Memory access execution circuitry is also provided for issuing to the memory device access requests selected from the storage device. The issuance of the access requests occurs via an intervening physical layer interface which receives the access requests from the memory access execution circuitry and manages the onward propagation of the access requests to the memory device. The physical layer interface is provided for managing the communication with the memory device taking into account the nature of the physical connection with the memory device. That physical connection will typically comprise multiple relatively long physical wire connections, and be required to operate as a parallel interface at high speed. The physical layer interface operates in a manner to maintain synchronised communication across that physical connection with the memory device.

Due to the nature of the physical connection, time varying effects can be introduced that can affect the ability to correctly synchronise the various signals, and hence it is typically the case that such a physical layer interface needs to be subjected to a periodic training operation during which test commands are issued over the physical connection to the memory controller in order to enable performance of any necessary recalibration of the phase delay circuits and the like used to ensure synchronised communication with the memory device. In particular, control circuitry may be provided that is responsive to a training event to initiate a training operation of the physical layer interface. The training event can take a variety of forms, for example the elapse of a periodic timer, or the indication of an approaching error condition, for example by analysis of one or more properties of the signals being passed over the physical connection between the physical layer interface and the memory device.

In accordance with the embodiments described herein, advantage is taken of the requirement for periodic training operations to be performed in respect of the physical layer interface, to use those periods of time to also perform maintenance operations on the storage elements provided within the storage device, hence enabling the potential performance impact of such maintenance operations to be hidden. In particular, whilst the training operation is being performed in respect of the physical layer interface, the pending access requests cannot be processed, and accordingly there is no active memory access processing performed during that period of time. In accordance with the described embodiments, the control circuitry is responsive to the training event to trigger performance of the maintenance operation by the maintenance circuitry whilst the training operation is being performed. The maintenance operation is hence performed at a time when the pending access requests cannot in any event be processed, and accordingly the performance of the maintenance operations during that period provides no further impact on the memory access performance.

This hence provides a very efficient mechanism for facilitating performance of the maintenance operations, by triggering performance of those maintenance operations during a period where there is already a "downtime" in the memory access functionality due to the training operation being performed on the physical layer interface. This can be particularly beneficial in situations where the amount of maintenance tasks desired to be performed are at a level where they could impact the overall performance of the memory access operations by introducing a source of contention for access to the storage elements. In particular, those storage elements will need accessing whilst performing the normal processing of the pending access requests in order to access the required data in the memory device, and if the maintenance operations are at the same time also needing to access the storage elements this can compromise performance, particularly as the volume of maintenance tasks required increases.

There are a number of ways in which the control circuitry can trigger performance of the maintenance operation by the maintenance circuitry in response to the training event. For example, the control circuitry may in one embodiment be arranged to issue a control signal to the maintenance circuitry to trigger the performance of the maintenance operation. Hence, in such an embodiment the control circuitry may be able to directly contact the maintenance circuitry in order to trigger the performance of a maintenance operation.

In an alternative embodiment, the control circuitry may not directly contact the maintenance circuitry, but could instead perform an alternative action that would trigger performance of the maintenance operation. For instance, in one embodiment the control circuitry may be responsive to the training event to update a control register to a value that triggers the maintenance circuitry to perform the maintenance operation. As a particular example, the control register may be arranged such that when its value is updated to a predetermined value, this causes an interrupt to occur, that may for instance cause an exception routine to be performed that triggers performance of the maintenance operation. Hence, the control circuitry can be responsive to the training event to update the control register value to that predetermined value, to thus initiate the interrupt mechanism to trigger performance of the maintenance operation.

To assist the maintenance circuitry in planning the maintenance activities to be performed when the maintenance operation is triggered by the control circuitry, the control circuitry can in one embodiment be arranged to issue an indication of an expected duration of the training operation, and the maintenance circuitry may then be arranged to reference that indication when determining the storage elements to be subjected to the maintenance operation. Hence, the maintenance circuitry can be informed of the length of time available during which the maintenance operation can be performed without any impact on data access performance, since it is known that there will be no data accesses taking place to the memory device in respect of pending access requests whilst the training operation is being performed.

The indication of the expected duration of the training operation that is provided by the control circuitry can take a variety of forms. For instance, it could directly identify the time period concerned, for example by reference to a number of clock cycles. Alternatively, it may be sufficient to identify the type of training that is being performed by the training operation. In particular, dependent on the nature of the training event, the type of training that needs to be performed may differ, and different types of training may have different expected durations. In one embodiment, the maintenance circuitry can be arranged to have access to stored timing information identifying the expected duration of the training operation for each of a plurality of different types of training. In that event, the indication issued by the control circuitry when triggering the maintenance operation may be arranged to provide an indication of the type of training being performed by the training operation, with the maintenance circuitry then using this information to determine the time available for performing maintenance tasks.

In an alternative embodiment the control circuitry may not provide any timing indication information and instead may be arranged to notify the maintenance circuitry on completion of the training operation. In such an embodiment, the maintenance circuitry can then continue to perform maintenance tasks until such time as it is notified that the training operation has completed. It can for example be responsive to that information to terminate the maintenance operation at the next suitable point, for example when any maintenance task in flight at the time the maintenance circuitry is advised of the completion of the training operation has completed.

As a yet further alternative, when the maintenance operation is triggered by the control circuitry, the maintenance circuitry may be arranged to perform the maintenance operation for a default period of time. The default period of time could be selected in a variety of ways, but could for example correspond with a minimum expected duration of the training operation.

The control circuitry can take a variety of forms. In one embodiment, it may take the form of a dedicated hardware circuit configured to perform the training operation. That hardware circuit will then additionally be configured to issue a signal to trigger performance of the maintenance operation when the training operation is initiated. However, in an alternative embodiment, the control circuitry may take the form of a more general purpose processing circuit that is arranged to execute firmware to perform the training operation. The firmware will then also cause the necessary signal to be issued to trigger performance of the maintenance operation when the training operation is initiated.

In one embodiment where the control circuitry is a dedicated hardware circuit, that dedicated hardware circuit may be provided with a specific path via which it can issue a trigger signal directly to the maintenance circuitry to initiate the maintenance operation.

In one embodiment where the control circuitry takes the form of more general purpose processing circuitry executing firmware, then that processing circuitry may be connected via a peripheral bus to various other components within the system, including some control registers used to control operation of components within the system. One of those control registers may be arranged to be a register that, when set to a particular value, triggers an interrupt that then causes the maintenance operation to be initiated.

The storage device containing storage elements that are to be subjected to the maintenance operation can take a variety of forms. In one embodiment, the storage device comprises a pending access requests buffer, and at least the data portions of the access requests are stored in the storage elements subjected to the maintenance operation. For example, in one particular embodiment the data portions of the access requests may be stored in Static Random Access Memory (SRAM) cells within the storage device, and those SRAM cells may be subjected to the maintenance operation. In one embodiment, the storage device may use other structures for storing other parts of the request. For example, flops may be used to store the command/address information associated with each access request. Such storage structures may not need to be subjected to the maintenance operation, and hence it may not be the entirety of the storage device that is subjected to the maintenance operation. However, in an alternative embodiment all of the information of each access request may be stored in SRAM cells, including the command/address information, and all of those SRAM cells may be subjected to the maintenance operation.

In addition to the pending access requests buffer, or as an alternative to such a buffer, the storage device may comprise other components, for example a cache structure, and at least a portion of the cache structure may be formed from storage elements subjected to the maintenance operation. For example, within a System-on-Chip (SoC), a final level cache may be quite closely coupled with the memory controller functionality, and hence regions of the cache may be used for holding access request information. As such, accesses to such a cache structure may significantly reduce, or stop, during periods where the physical layer interface is being subjected to the training operation, due to the fact that no active access requests are processed during that period. This period hence also represents a suitable period of time for performing maintenance tasks in respect of the storage elements within the cache structure, and accordingly the trigger from the control circuitry can be propagated on to such a cache structure to initiate those maintenance tasks during that period.

The maintenance operation can take a variety of forms. For example, in one embodiment the maintenance circuitry comprises a built-in self-test (BIST) controller arranged to perform the maintenance operation in order to provide error robustness maintenance. In particular, the maintenance operation performed by the BIST controller may seek to determine the presence of any hard errors in the storage elements. For example, for a series of storage elements used to store one or more data values, that one or more data values may be temporarily buffered elsewhere, and then a series of write and read accesses may be performed to that series of storage elements using known patterns in order to seek to detect any situation where the read pattern differs from the written pattern, and hence may indicate a hard fault. This is potentially a time intensive exercise that could significantly impact memory access performance if it were to be undertaken during "live" use where access requests are actively being processed. However, by restricting these operations to periods of time where the physical layer interface is being trained, there is no such impact, and hence this provides a very efficient mechanism for performing such BIST testing.

As an alternative, or in addition, the maintenance circuitry may comprise scheduling circuitry arranged to perform the maintenance operation in order to improve performance of the memory accesses identified by the access requests. In contrast to the above described BIST style of maintenance operation, the maintenance operation performed by the scheduling circuitry can seek to use techniques such as access request merging, and scheduling/reordering techniques to seek to optimise performance of memory accesses. Whilst such maintenance can be performed as a background task during live use of the system, the time taken to perform such maintenance can increase as the size of the storage device increases, and hence there is the potential for the performance of such background maintenance tasks to either impact performance of the actual access request processing, due to the contention they introduce in access to the storage elements, or for the scheduling circuitry to struggle to find sufficient time to perform the desired maintenance tasks. However, by allowing the scheduling circuitry to perform such maintenance tasks in the period where the physical layer interface is being trained, the maintenance circuitry can perform such maintenance tasks without introducing any contention with respect to the live data access traffic. It hence, for example, can increase the aggressiveness of the maintenance tasks during such a period, by increasing the rate at which the storage elements are subjected to maintenance during that period when the training operation is being performed. This can be done without any risk of impacting performance of the memory access activity, due to memory access activity in any event having been halted during the period where the physical layer interface training is taking place.

The training operation can take a variety of forms. However, in one embodiment the training operation adjusts operation of the physical layer interface to compensate for delay in signals propagating over a connection between the physical layer interface and the memory device.

In another embodiment, the present technique provides a method of performing a maintenance operation within an apparatus that controls access to a memory device, comprising: storing in a storage device access requests to be issued to the memory device; employing maintenance circuitry to perform the maintenance operation on storage elements provided within the storage device; issuing to a physical layer interface access requests selected from the storage device, for onward propagation from the physical layer interface to the memory device; responsive to a training event, employing control circuitry to initiate a training operation of the physical layer interface; and causing the control circuitry to trigger performance of the maintenance operation by the maintenance circuitry whilst the training operation is being performed.

Particular embodiments will now be described with reference to the Figures.

FIG. 1 is a block diagram of a data processing system in accordance with one embodiment. As shown, a number of requesting devices 10, 15, 20 are arranged to issue access requests in respect of data held in a memory device 40. The requesting devices can take a variety of forms, and hence for example may comprise a central processing unit (CPU), a graphics processing unit (GPU), a cache, etc. The memory device 40 has a memory controller 30 associated therewith that is arranged to receive the various access requests from the requesting devices 10, 15, 20, and to then schedule those access requests for processing within the memory device 40. The access requests are issued from the memory controller 30 to the memory device 40 via an intervening physical layer interface 35. It is often the case that the memory device 40 is provided off-chip, and the physical connection between the memory controller 30 and the memory device 40 may often compare multiple relatively long wires that need to be used to provide a high speed, parallel interface. The physical layer interface 35 employs mechanisms to maintain synchronous communication at high speed over those connection wires in order to ensure that a high speed, parallel interface can be achieved.

There are a number of ways in which the requesting devices 10, 15, 20 may be coupled with the memory controller 30, but in the arrangement shown in FIG. 1 it is assumed that there is an intervening interconnect structure 25 via which the requesting devices communicate with the memory controller 30. In addition to providing the routing interface for interconnecting the various requesting devices with the memory controller, and indeed with any other slave devices connected to the interconnect 25, the interconnect can also incorporate other functionality. For example, it may be arranged to implement a cache coherency protocol to ensure that the contents of various caches within the system are kept coherent. These caches may include caches that are provided locally in association with each of the requesting devices 10, 15, 20, as well as other shared caches, an example of which may be a last level of cache 60 provided within the interconnect 25.

The memory device 40 can take a variety of forms, but in one embodiment is a dynamic random access memory (DRAM) device, which may be organised in a standard manner in a series of ranks, banks, rows and columns.

Whilst in one embodiment a single memory controller 30 may control the entire memory device, in some embodiments the memory device is partitioned into multiple parts, with each part having an associated separate memory controller and associated physical layer interface. Considering the example of DRAM, the memory device may be partitioned into multiple channels 40, 55, with each channel having a separate memory controller 30, 45 and associated physical layer interface 35, 50. The other memory controller 45 and physical layer interface 50 will be constructed in the same way as the memory controller 30 and physical layer interface 35, more details of which will be discussed later with reference to FIG. 2.

In one embodiment, the various requesting devices 10, 15, 20, the interconnect 25, and the memory controllers 30, 45 may all be provided within a System-on-Chip (SoC). The physical layer interface 35, 50 may in one embodiment also be provided on-chip, or may be provided off-chip at the interface with the memory controller 30, 45. In one embodiment, the memory device 40, 55 is provided off-chip and connected via connection wires with the physical layer interface 35, 50.

Typically there will be an on-chip communication protocol used for communications routed between the various components. In one embodiment the protocol used on-chip may be different to the protocol used for communication with the memory device, which is illustrated schematically in FIG. 1 with reference to the various interconnections. For example, the on-chip communication protocol may have at least one channel over which a request can be issued from the requesting devices 10, 15, 20, with separate write data and read data channels for the propagation of write data and read data. The request channel may in fact comprise one or more separate channels, for example a separate write address channel and a separate read address channel. A response channel may also be provided for routing responses back to the requesting device. The response data can take a variety of forms, and may include for example an acknowledgement signal to acknowledge that a write request has been accepted for processing. The response channel can also be used to indicate when particular access requests have failed for certain reasons.

In one particular example embodiment, the on-chip communication protocol may be the AMBA eXtensible Interface (AXI) protocol developed by ARM Limited, Cambridge, United Kingdom.

The memory controller 30, 45 will in one embodiment not only handle the scheduling of the pending access requests, but also perform protocol conversion to convert from the on-chip communication protocol to the communication protocol used to communicate with the off-chip memory device 40, 55. For a DRAM memory device, the communication protocol may require the issuance of a series of commands of different types over a command propagation path, along with the propagation of write and read data over a data path.

Figure 2:
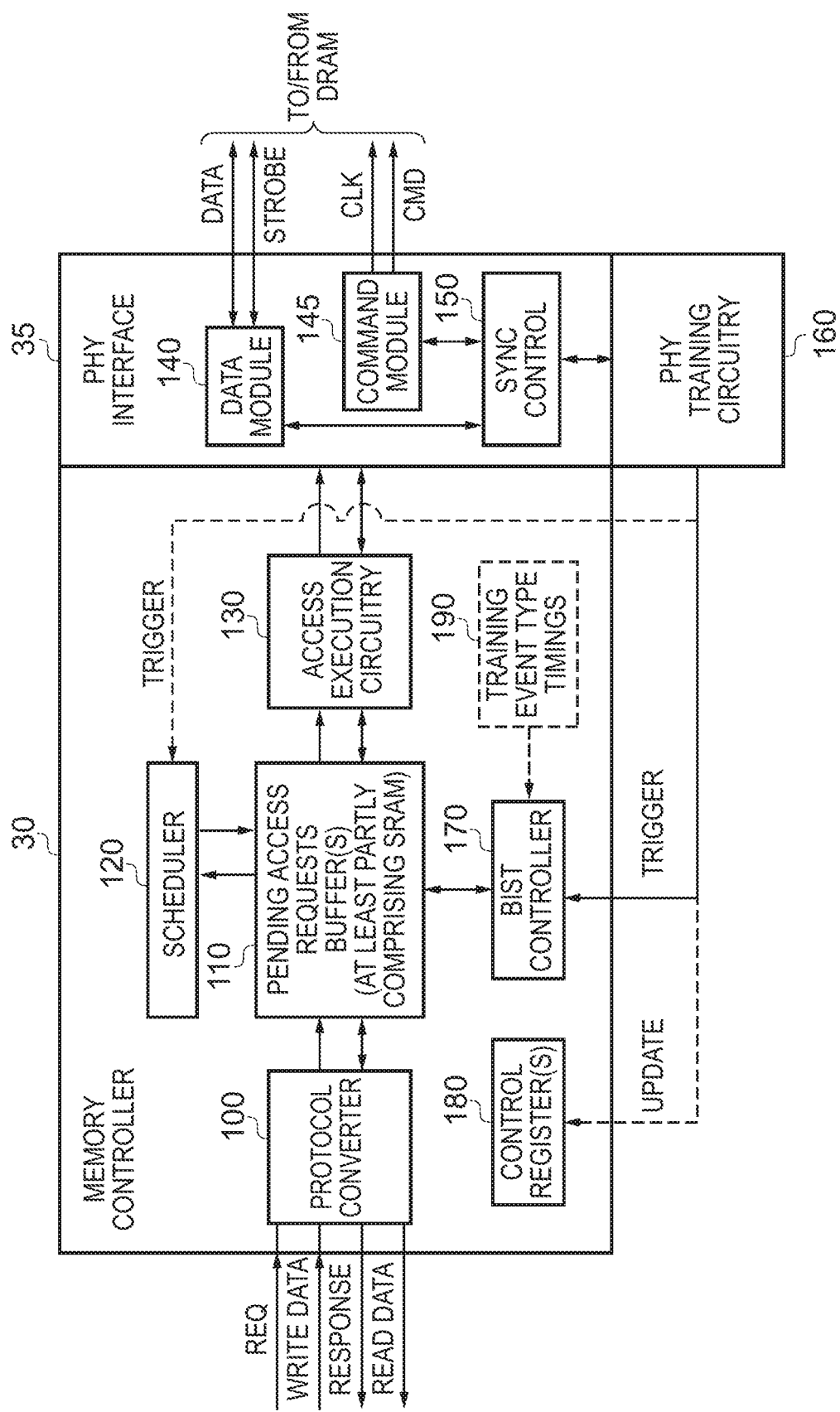
FIG. 2 is a block diagram illustrating in more detail the memory controller and physical layer interface of FIG. 1 in accordance with one embodiment.

FIG. 2 is a block diagram illustrating in more detail components provided within the memory controller 30 and the physical layer interface 35 in accordance with one embodiment. The memory controller 30 includes a protocol converter 100 for converting between the communication protocol used over the interconnect 25 and the protocol to be used for communicating with the memory device 40. As each request is received, it is converted and then placed into a pending access requests buffer, or buffers, 110. Each pending access request in the buffer will identify the address to be accessed, along with associated information such as the type of access to be performed. In the event of a write request, the write data can also be buffered in the pending access request buffer(s).

A scheduler circuit 120 is used to perform scheduling operations in respect of the contents of the pending access request buffer(s) in order to determine the order in which to issue the pending access requests to the memory device. This can take into account the structure and organisation of the memory device in order to seek to optimise the performance of the memory accesses. For example, when a particular page is open in DRAM memory, it is typically more efficient to continue to access the contents of that page rather than closing the page and opening another page. Hence, pending access requests can be reordered by the scheduler with the aim of seeking to perform multiple accesses to an open page in the DRAM memory. Access execution circuitry 130 is used to issue selected access requests from the buffer 110 (as ordered by the scheduler 120) to the physical layer interface for onward propagation over the physical connection medium to the memory device 40.

The physical layer interface 35 includes a command module 145 for issuing the command signal which will identify the type of access and the address being accessed, and a data module 140 for outputting write data to the memory device, or for receiving read data from the memory device.

A synchronisation control component 150 controls the operation of the command module and the data module in order to maintain synchronous communication over the physical connection between the physical layer interface 35 and the memory device 40. The synchronisation control block will include a number of circuits such as phase-lock-loop circuits and delay-lock-loop circuits that are configured to seek to take account of delays, both relative and absolute, in the paths between the physical layer interface and the memory device. In one embodiment, a clock signal is issued in association with the command signal from the command module to provide a timing reference, and a strobe signal is issued in association with the data signals to ensure that the data is latched on appropriate clock edges of the clock signal.

Over time, drift can be introduced into the signals propagating over the connection between the physical layer interface 35 and the memory device 40 due to a variety of factors, for example changes in operating temperature and voltage, etc. Hence, periodically a training operation may need to be performed on the physical layer interface 35 in order to update the configuration of the synchronisation control block 150 (to adjust phase delays and the like). Physical layer training circuitry 160 can be provided for performing such a training operation as and when required, and can apply a number of processes such as read/write levelling, data eye training, per-bit data deskew control, and PVT (process, voltage, temperature) compensation using any of a number of known techniques. The training circuitry 160 may be arranged to initiate the training operation periodically, for example on elapse of a predetermined time period, or may be arranged to actively monitor the quality of the signals being communicated over the connection with the memory device so as to seek to detect when such drifting issues are reaching a point where there is an unacceptable probability that an error may soon occur. There are a number of properties in the signals that could be monitored, for example the signal to noise ratio on data capture. When a threshold is exceeded, then the training operation could be initiated.

Whenever the training operation is performed, it is necessary to stall performance of the pending access requests, and accordingly during the period in which the physical layer interface 35 is undergoing a training operation, no pending access requests will be issued from the access execution circuitry 130.

The storage structures that are used to form the pending access requests buffer(s) 110 can take a variety of forms. However, in one embodiment at least the storage elements used to store the write data (and any read data that is temporarily buffered when being returned via the access execution circuitry to the protocol converter for onward propagation to the interconnect) comprise SRAM cells. In some embodiments, the remaining parts of the access request information, for example the address and access type information, can be stored in different storage structures such as flops, or alternatively such information may also be stored in SRAM cells if desired.

In one embodiment a built-in self-test (BIST) controller 170 is provided for performing periodic checks on the SRAM cells in order to determine the presence of any hard errors, indicating faults in the operation of individual SRAM cells. It is typically the case that such BIST test procedures are performed at manufacture time, and optionally at boot time, but previously it has been not typically considered necessary to perform such tests during "live" operation of the memory controller. However, certain emerging applications are becoming highly sensitive to errors, and in such applications it is advantageous to be able to perform such BIST testing periodically whilst the memory controller is being used, so that any faulty cells can be bypassed and no longer used (often a certain number of redundant cells can be provided that can be switched in in place of any such bypassed cells).

However, the BIST testing process can be relatively lengthy and could impact on the overall performance of the memory access processing. For example, a typical BIST testing operation may temporarily store the current data content from a series of memory cells into a buffer, and then perform one or more write and read sequences where known patterns are written to the cells and then read back from the cells in order to seek to detect situations where any of the cells are exhibiting a hard error. Assuming that test process is passed, then the data that has been temporarily buffered can be written back into the cells, and the BIST controller 170 can update its records to identify that that series of cells has passed the test. If any cells fail the test, then that fail condition can be flagged to a suitable agent such as a firmware agent, that can then run a process to invalidate the affected SRAM cell or cells, and ideally utilise redundant cells instead. It will be appreciated that due to the multiple write and read sequences required, this introduces a significant source of contention for access to the SRAM cells when undertaking the normal read/write activity required in order to process the pending access requests, and hence could potentially significantly adversely affect the memory access processing performance.

In one embodiment, this potential impact is alleviated by arranging the BIST controller 170 to perform such BIST testing whilst a training operation is being performed in respect of the physical layer interface 35. In particular, the physical layer training circuitry 160 is arranged, when a training event occurs that causes the training circuitry to determine that a training operation should be initiated on the physical layer interface 35, to also issue a trigger to the BIST controller 170 to trigger performance of the BIST maintenance operation. This means that the BIST maintenance operation can be performed during a period of time when no active pending access requests can be processed anyway, and accordingly no such contention issues arise.

The training circuit 160 may be a dedicated hardware circuit used to perform the training operation, by liaising with the synchronisation control block 150 in order to cause a series of test commands to be issued to the memory, with the various signals being monitored in order to determine how best to adjust the various synchronisation control parameters maintained within the synchronisation control block 150. In such an embodiment, the training circuitry may be provided with a dedicated connection via which it can issue the trigger signal directly to the BIST controller 170 as shown in FIG. 2.

However, in an alternative embodiment, the training circuitry 160 may be implemented by a more general purpose processor executing firmware in order to perform the training operation. Typically such a processor may be connected via a peripheral bus with various components of the memory controller 30 and the physical layer interface 35 in order to not only perform the training operation in respect of the physical layer interface 35, but also to set values in certain control registers 180 of the memory controller to control the operation of the memory controller. In one such embodiment, one of the control registers 180 can be used to maintain a value which, when set to a predetermined value, triggers an interrupt that causes an exception routine to be performed in order to initiate the BIST maintenance operation by the BIST controller 170. Hence, as shown by the dotted line in FIG. 2, instead of issuing a trigger directly to the BIST controller, in such an embodiment the training circuitry 160 may update the relevant control register 180 in order to trigger performance of the BIST maintenance operation by the BIST controller 170.

In alternative embodiments using the firmware approach, any other handshaking method could be used instead of the control register update approach.

Once the BIST controller 170 has been triggered to perform the BIST maintenance operation in such a manner, there are a number of mechanisms that can be used to determine how long the BIST controller should continue to perform that maintenance operation for. If it can be guaranteed that the entire block of SRAM cells can be subjected to BIST maintenance during the period that the physical layer interface 35 is being subjected to the training operation, then it can merely perform the entire BIST testing process on all SRAM cells and then terminate. However, where there is potential for the BIST testing operation to last longer than the time taken to perform the training operation, then it may be appropriate to introduce measures to ensure that the BIST testing operation is performed in multiple stages, with each stage being performed so as to coincide with a training operation.

In that latter event, the BIST controller may in one embodiment be provided with information about the expected length of time of the training operation. This could be provided directly by the training circuitry 160 in association with the trigger information, with the BIST controller then tailoring the number of SRAM cells that it subjects to the BIST test process accordingly. Alternatively, the BIST controller may have access to some stored information 190 providing information about the expected timings for different types of training events, and the training circuitry 160 may provide, in association with the trigger or update signal, information about the type of training to be performed by the current training operation. In particular, dependent on the nature of the training event that causes the training to be initiated, the type of training performed may differ, and the duration may hence differ. However, by providing the BIST controller with information about the type of training being performed, and having access to the information in the storage 190, the BIST controller can again determine a suitable length of time that it has available for performing BIST testing, and choose the SRAM cells to be subjected to BIST testing accordingly.

The BIST controller 170 can keep records of which SRAM cells have been tested, so that as each training operation takes place, it can perform testing on another block of SRAM cells so as, over time, to perform BIST testing on all of the SRAM cells.

As a yet further alternative, if no timing information is provided from the training circuitry 160, the BIST controller may be arranged to just perform BIST testing for a predetermined period of time. For example, that predetermined period of time may be set so as to represent an expected shortest period of the training operation so as to ensure that any BIST testing is completed by the time the training operation completes, and hence the BIST testing will not impact on the efficiency of processing of the pending access requests when the system goes live again following the end of the training operation on the physical layer interface 35.

Whilst in the above example the maintenance operation that is performed whilst the training operation is taking place is a BIST testing operation, the maintenance operation can alternatively, or in addition, take other forms. For example, the scheduler 120 may already be arranged to perform certain maintenance operations as a background task during live operation of the memory controller, in order to seek to improve the overall performance of the memory access operations. For example, it could seek to merge certain requests and can perform certain scheduling/reordering operations on the contents of the pending access requests buffer 110. Whilst these can be performed as a background activity during normal use, there is a limit as to how much of that type of maintenance can be performed before the maintenance itself begins to impact on the throughput of the access requests due to the contention it introduces in the read and write accesses to the SRAM cells. Accordingly, in one embodiment the trigger could also optionally be provided to the scheduler 120 (or indeed could be provided instead to the scheduler rather than to the BIST controller 170), to enable the scheduler to more aggressively perform such maintenance operations during the period when the training circuitry 160 is performing its training operation on the physical layer interface 35. In particular, since it is known that during that period no pending access requests will be being processed, then the contention issue is removed, and the scheduler can increase the rate at which the SRAM cells are subjected to such maintenance operations. If desired, the scheduler 120 could also have access to the training event type timings in the storage 190 in order to determine a suitable length of time during which to aggressively schedule such maintenance operations.

Figure 3:
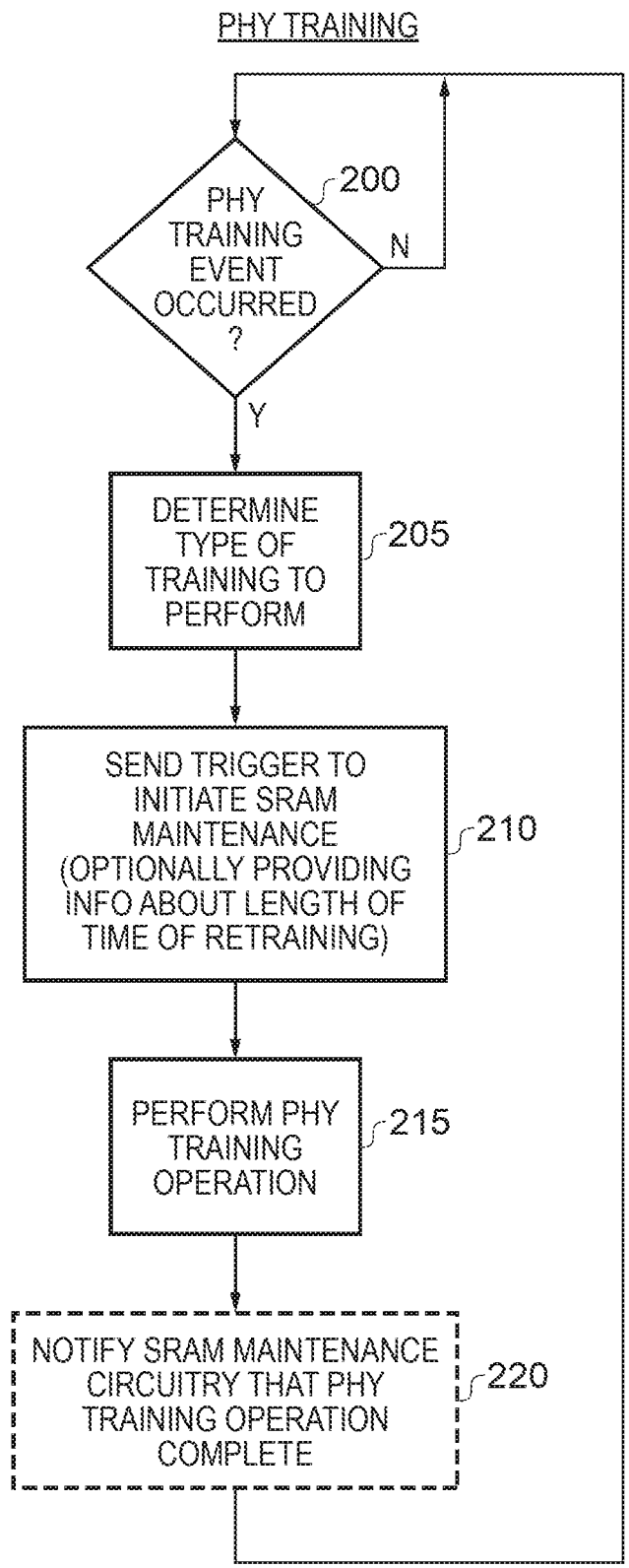
FIG. 3 is a flow diagram illustrating the operation of the physical layer training circuitry of FIG. 2 in accordance with one embodiment.

FIG. 3 is a flow diagram illustrating the operation of the training circuitry 160 in one embodiment. At step 200, the training circuitry determines whether a physical layer ("phy") training event has occurred. As mentioned earlier, such a training event could occur due to the elapse of a timer, or due to the training circuit's monitoring of various signals issued through the physical layer interface 35 being indicative of an approaching error point being reached, for example due to drifting in the signals over the various physical wires.

Once a training event is detected, then at step 205 the type of training to be performed is determined. At step 210, a trigger is then sent (optionally with associated timing information) to initiate SRAM maintenance in respect of the SRAM cells of the pending access requests buffer(s) 110, and then at step 215 the training operation is performed on the physical layer interface 35. Thereafter, the process may return to step 200, or optionally step 220 may be implemented where the training circuitry notifies the SRAM maintenance circuitry that the training operation is complete. That information could then be used by the maintenance circuitry (whether that be the BIST controller 170 or the scheduler 120) to terminate the ongoing maintenance operation, since once the training operation is complete, the memory controller 30 can return to live operation where the pending access requests can again begin to be processed for issuance to the memory device 40.

Figure 4:
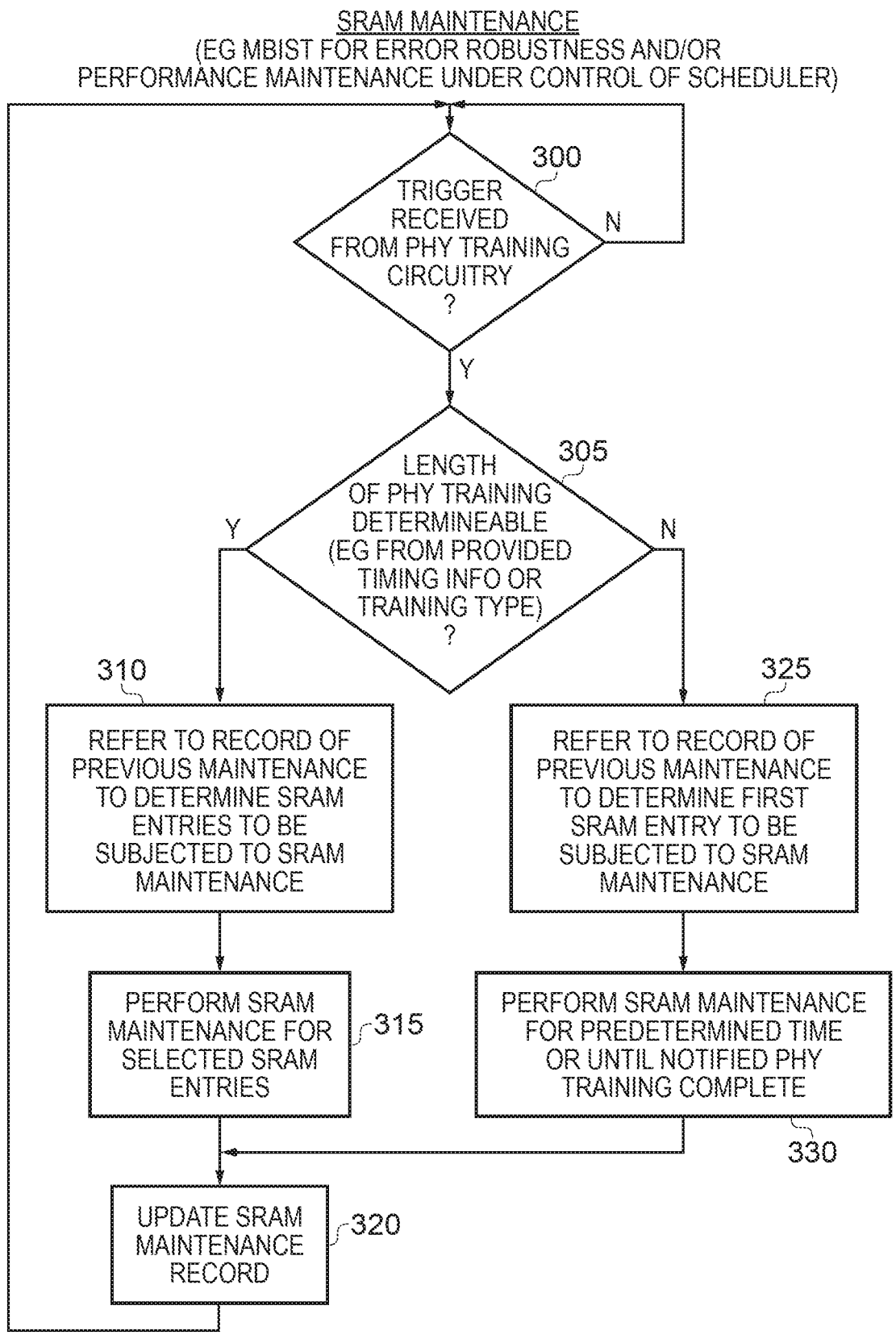
FIG. 4 is a flow diagram illustrating the performance of SRAM maintenance in accordance with one embodiment.

FIG. 4 is a flow diagram illustrating the SRAM maintenance operation that may be performed in accordance with one embodiment. Whilst this process will be described with reference to the operation of the BIST controller 170, the same logical process can be applied by the scheduler 120 if it is arranged to respond to the trigger signal by performing certain maintenance operations.

At step 300, it is determined whether a trigger is received from the training circuitry, and once received, it is then determined at step 305 whether the length of the physical layer training operation is determinable. As mentioned earlier, this may be due to the training circuitry directly identifying the length of time that it is expecting to perform the training operation, or by the training circuitry identifying the type of training being performed, and the BIST controller having access to additional information to determine an expected length of time for such training. Assuming the length of time expected in relation to the training operation is determinable, then the process proceeds to step 310 where the maintenance circuitry refers to its record of previous maintenance in order to determine which SRAM cells (also referred to in FIG. 4 as SRAM entries) to be subjected to SRAM maintenance. In one embodiment, SRAM maintenance may be performed on a round-robin basis so that the least recently tested cells are the ones that are subjected to the current block of SRAM maintenance tasks. The number of SRAM cells to be subjected to SRAM maintenance during the current iteration will then be determined having regard to the timing information obtained at step 305.

At step 315, the SRAM maintenance is then performed for the selected SRAM cells, whereafter at step 320 the SRAM maintenance record is updated to identify that those cells have been subjected to the SRAM maintenance. The process then returns to step 300.

If at step 305 it is determined that the length of time expected for the training operation is not determinable, then the process proceeds to step 325 where the record of previous maintenance is referred to in order to determine the first SRAM cell to be subjected to SRAM maintenance. Thereafter, at step 330 SRAM maintenance is performed on a series of SRAM cells starting with the first entry identified in step 325, either for a predetermined time period, or until the maintenance circuitry is notified that the training operation has completed. At that point, the process then proceeds to step 320 where the SRAM maintenance record is updated, and the process returns to step 300.

Whilst in the embodiments described so far, it is assumed that the maintenance operation is performed in respect of the SRAM cells present within the pending access requests buffer(s) 110, such maintenance operations may additionally, or alternatively, be performed in respect of other storage structures within the system. As one particular example, the last level of cache 60 shown in FIG. 1 may be relatively closely coupled with the memory controller, such that at least a significant portion of that cache is used to store information pertaining to pending access requests to the memory device 40. That cache may also consist of SRAM cells that would desirably be subjected to certain SRAM maintenance operations. Given that that level of cache is quite closely coupled to the memory controller, it is likely that the accesses to that cache may significantly diminish, or indeed stop, during a period of time where the physical layer interface 35 is being subjected to a training operation. This hence represents an ideal period of time in which to perform some of the required SRAM maintenance operations in respect of that cache. Accordingly, the trigger signal issued by the training circuitry could if desired be issued to maintenance control circuitry for such a cache 60, in order to initiate performance of maintenance tasks in respect of the cache during the period in which the training operation is being performed on the physical layer interface 35.

Figure 5:
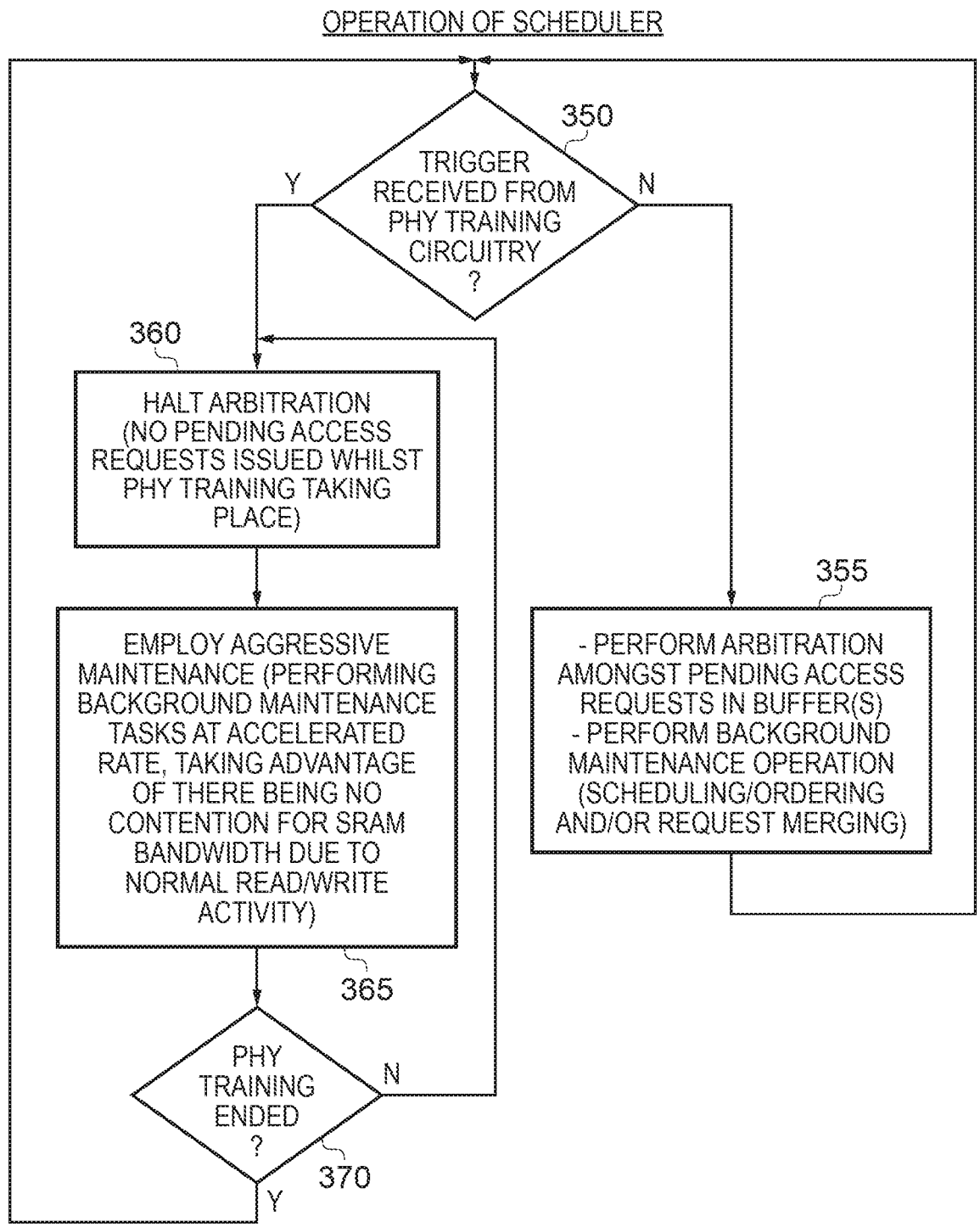
FIG. 5 is a flow diagram illustrating the operation of the scheduler of FIG. 2 in accordance with one embodiment.

FIG. 5 is a flow diagram illustrating the operation of the scheduler 120 in one embodiment, and in particular the scheduler's operation in respect of maintenance operations, in an embodiment where the scheduler performs certain maintenance operations as a background task, but can be configured to be responsive to the trigger signal from the training circuitry to accelerate performance of those maintenance operations. At step 350, it is determined whether a trigger has been received from the training circuitry 160. If not, then as indicated by step 355, the scheduler continues to perform background maintenance tasks at the same time as access requests are actively being processed by the memory controller. These background maintenance tasks may include certain scheduling/ordering tasks and/or request merging tasks as discussed earlier. At the same time, the scheduler will typically perform arbitration amongst the pending access requests in the buffer in order to decide which access requests the access execution circuitry 130 issues via the physical layer interface 35 to the memory device 40. This process continues until receipt of the trigger signal is detected at step 350.

Once the trigger signal is received, then processing instead branches to the left-hand side of the flow shown in FIG. 5. At step 360 the arbitration process is halted, since no pending access requests will be issued whilst the physical layer training operation is taking place. At step 365, the scheduler then employs aggressive maintenance, where the maintenance tasks that would typically be performed as background maintenance tasks are performed at an accelerated rate, taking advantage of there being no contention for SRAM bandwidth due to normal read/write activity. In particular, that normal read/write activity is not currently taking place due to no memory accesses being processed by the memory controller at the current time. The halting of the arbitration process, and the performance of aggressive maintenance, continues until it is determined at step 370 that the training operation in respect of the physical layer interface 35 has ended, at which point the process returns to step 350. At this point, no trigger will have been received, and the process will then proceed to step 355 where the normal operation of the scheduler is resumed.

Operating the scheduler in the manner illustrated schematically in FIG. 5 can be particularly beneficial when the size of the buffer(s) 110 increase. For example, in situations where the information that informs the scheduler as to how to reorder the pending access requests is stored in SRAM memory, this ordering function may take a relatively long time, or could become better by taking a longer time to read through other SRAM entries, and this additional time can be accommodated without impacting the overall processing performance of the memory access requests by concentrating performance of such tasks in periods where the physical layer interface is being subjected to a training operation.

From the above described embodiments, it will be seen that such embodiments provide an improved mechanism for handling maintenance operations in respect of storage elements associated with a memory controller, by concentrating the performance of those maintenance operations into periods of time where system transactions already need to be stalled, due to the requirement to perform a training operation in respect of the physical layer interface. In particular, the downtime introduced by the performance of the physical layer interface training is taken advantage of to also during that period perform certain maintenance operations on the storage elements, hence preventing the performance of those maintenance operations having any additional adverse effect on the memory access performance of the system. Where the runtime of the required maintenance tasks is mismatched with the timing required for performing the training operation, the maintenance circuitry can be configured to perform partial maintenance so as to only test certain parts of the SRAM memory array during each physical layer training process, so that over a number of iterations of the training operation the entire SRAM array can be tested.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus for controlling access to a memory device, comprising:
a storage device to store access requests to be issued to the memory device;
maintenance circuitry to perform a maintenance operation on storage elements provided within the storage device;
memory access execution circuitry to issue to a physical layer interface access requests selected from the storage device, for onward propagation from the physical layer interface to the memory device; and
control circuitry, responsive to a training event, to initiate a training operation of the physical layer interface;
the control circuitry further being responsive to the training event to trigger performance of the maintenance operation by the maintenance circuitry while the training operation is being performed, wherein:
the maintenance circuitry comprises scheduling circuitry configured to perform the maintenance operation in order to improve performance of the memory accesses identified by the access requests;
in the absence of the training operation being performed, the scheduling circuitry is configured to perform a background maintenance operation while also performing arbitration of the access requests to determine which access requests are issued by the memory access execution circuitry; and
while the training operation is being performed, the scheduling circuitry is configured to cease performing arbitration and to perform as the maintenance operation an accelerated version of the background maintenance operation which increases the rate at which storage elements are subjected to maintenance during the period when the training operation is being performed.

2. An apparatus as claimed in claim 1, wherein the control circuitry is arranged to issue a control signal to the maintenance circuitry to trigger the performance of the maintenance operation.

3. An apparatus as claimed in claim 1, wherein the control circuitry is responsive to the training event to update a control register to a value that triggers the maintenance circuitry to perform the maintenance operation.

4. An apparatus as claimed in claim 1, wherein the control circuitry is arranged to issue an indication of an expected duration of the training operation, and the maintenance circuitry is arranged to reference that indication when determining the storage elements to be subjected to the maintenance operation.

5. An apparatus as claimed in claim 4, wherein said indication of an expected duration of the training operation indicates a type of training to be performed by the training operation, and the maintenance circuitry has access to stored timing information identifying the expected duration of the training operation for each of a plurality of different types of training.

6. An apparatus as claimed in claim 1, wherein the control circuitry is arranged to notify the maintenance circuitry on completion of the training operation.

7. An apparatus as claimed in claim 1, wherein when the maintenance operation is triggered by the control circuitry, the maintenance circuitry is arranged to perform the maintenance operation for a default period of time.

8. An apparatus as claimed in claim 1, wherein the control circuitry is one of a hardware circuit configured to perform the training operation or processing circuitry arranged to execute firmware to perform the training operation.

9. An apparatus as claimed in claim 1 wherein the storage device comprises a pending access requests buffer, and at least data portions of the access requests are stored in the storage elements subjected to the maintenance operation.

10. An apparatus as claimed in claim 1, wherein the storage device comprises a cache structure, and at least a portion of the cache structure is formed from storage elements subjected to the maintenance operation.

11. An apparatus as claimed in claim 1, wherein the maintenance circuitry comprises a built-in self-test controller arranged to perform the maintenance operation in order to provide error robustness maintenance.

12. An apparatus as claimed in claim 1, wherein the training operation adjusts operation of the physical layer interface to compensate for delay in signals propagating over a connection between the physical layer interface and the memory device.

13. A method of performing a maintenance operation within an apparatus that controls access to a memory device, comprising:
storing in a storage device access requests to be issued to the memory device;
employing maintenance circuitry to perform the maintenance operation on storage elements provided within the storage device;
issuing to a physical layer interface access requests selected from the storage device, for onward propagation from the physical layer interface to the memory device;
responsive to a training event, employing control circuitry to initiate a training operation of the physical layer interface; and
causing the control circuitry to trigger performance of the maintenance operation by the maintenance circuitry while the training operation is being performed, wherein:
the maintenance circuitry comprises scheduling circuitry performing the maintenance operation in order to improve performance of the memory accesses identified by the access requests;
in the absence of the training operation being performed, the scheduling circuitry performing a background maintenance operation while also performing arbitration of the access requests to determine which access requests are issued by the memory access execution circuitry; and
while the training operation is being performed, the scheduling circuitry ceasing performing arbitration, and performing as the maintenance operation an accelerated version of the background maintenance operation which increases the rate at which storage elements are subjected to maintenance during the period when the training operation is being performed.

* * * * *